United States Patent [19]

Anami

[11] Patent Number: 4,633,192
[45] Date of Patent: Dec. 30, 1986

[54] INTEGRATED CIRCUIT OPERATING AS A CURRENT-MIRROR TYPE CMOS AMPLIFIER

[75] Inventor: Kenji Anami, Itami, Japan

[73] Assignee: Mitsubishi Denki Kabushiki Kaisha, Tokyo, Japan

[21] Appl. No.: 607,645

[22] Filed: May 7, 1984

[30] Foreign Application Priority Data

May 18, 1983 [JP] Japan .................................. 58-88402

[51] Int. Cl.⁴ .............................................. H03F 3/16
[52] U.S. Cl. ...................................... 330/277; 330/288
[58] Field of Search ............... 330/253, 257, 277, 288; 323/315, 316; 307/451

[56] References Cited

U.S. PATENT DOCUMENTS 4,267,517  5/1981  Iida et al. ........................ 330/257 X

OTHER PUBLICATIONS

"Mixed MOS Type 64K Bit Static Ram", Mitsubishi Electric Corporation Technical Report, vol. 58, No. 8, 1984.

Primary Examiner—James B. Mullins
Attorney, Agent, or Firm—Birch, Stewart, Kolasch & Birch

[57] ABSTRACT

An integrated circuit operates as a current-mirror type CMOS amplifier. The integrated circuit is constructed of a first inverter and a second inverter. The first inverter is formed of a first P-channel FET whose source is connected to a power supply with a gate and a drain thereof being connected to a first node; and a first N-channel FET whose drain is connected to the first node with a gate thereof being connected to a first input terminal and with a source thereof being earthed. The second inverter is formed of a second P-channel FET whose source is connected to a power supply with a gate thereof being connected to the first node and with a drain thereof being connected to a second node; and a second N-channel FET whose drain is connected to the second node with a gate thereof being connected to a second input terminal and with a source thereof being earthed. The first inverter and the second inverter having different conductances which vary according to a predetermined ratio in order to reduce current consumption.

5 Claims, 6 Drawing Figures

INTEGRATED CIRCUIT OPERATING AS A CURRENT-MIRROR TYPE CMOS AMPLIFIER

FIELD OF THE INVENTION

The present invention relates to an integrated circuit operating as a current-mirror type CMOS amplifier.

BACKGROUND OF THE INVENTION

In order to explain the background of the invention, reference will be made to FIGS. 1 to 3:

In FIG. 1, there are two inverters: a first inverter INV1 constituted by a P-channel FET (field effect transistor) 1 and an N-channel FET 2, and a second inverter INV2 constituted by a P-channel FET 3 and an N-channel FET 4. The reference numerals 5 and 6 designate a first and a second input terminal connected to the gates of the N-channel FETs 2 and 4, respectively. The reference numerals 7 and 8 designate a first node and a second node, and the reference numeral 9 designates an output terminal.

Under the above-mentioned arrangement the input terminals 5 and 6 are to be applied by complementary signals, and the P-channel FETs 1 and 3, and the N-channel FETs 2 and 4 are designed such that their conductances g1 to g4 are in the relations of g1=g3 and g2=g4. The four FETs constitute a current-mirror type CMOS amplifier.

Referring to FIGS. 2 and 3, the operation of the circuit shown in FIG. 1 will be described:

In FIG. 2, when the voltages V5 and V6 of the input terminals 5 and 6 are equally Vr, the voltage-current characteristics of the N-channel FET 2 is represented by a curve I2. The voltage-current characteristics of the P-channel FET 1 can be represented by a curve I1 because the drain and the gate thereof are short-circuited. The curves I2 and I1 cross at a point P0, whose potential becomes an output voltage V7 of the first inverter INV1. The conductance of the second inverter INV2 is designed to be the same value as that of the first inverter INV1. The voltage-current characteristics of the P-channel FET 3 can be represented by a curve I3 because the gate thereof is connected to the first node 7, and that of the N-channel FET 4 can be represented by a curve I4. The curves I3 and I4 cross at the point P0, whose potential also becomes an output voltage V8 of the second inverter INV2. In this way the output voltages of the first and the second inverter INV1 and INV2 become equal.

At this stage, when complementary inputs V5a (=Vr+ΔVr) and V6a (=Vr−ΔVr) are applied to the input teminals 5 and 6, the curves I2, I3, and I4 change into curves I2a, I3a and I4a, respectively, and the crossing points P0 shift to P1 and P2. As a result, the output voltage V8a of the second inverter INV2 becomes higher than that at the point P0, the higher voltage at the point P2 being designated by VH.

In FIG. 3, when complementary inputs V5b (=Vr−ΔVr) and V6b (=Vr+ΔVr) are input to the input terminals 5 and 6, the curves I2, I3 and I4 change into curves I2b, I3b and I4b, and the crossing points P0 shift to P3 and P4. As a result, the output voltage V8b of the second inverter INV2 becomes lower than that at the point P0, the lower voltage at the point P4 being designated by VL.

In this way the input amplitude 2ΔVr which is a potential difference between the input terminals 5 and 6 is amplified to (VH−VL). That is, when the voltages V5 and V6 of the input terminals 5 and 6 are equal, currents of equal amplitude flow through the first inverter INV1 and the second inverter INV2, as is commonly called a "current mirror". However, it is a waste of electricity when currents of equal amplitude flow through the two inverters INV1 and INV2. This is a great disadvantage with the known devices.

OBJECTS AND SUMMARY OF THE INVENTION

The present invention is directed to solve the problems pointed out above with respect to the known devices, and has for its object to provide an improved integrated circuit capable of reducing the consumption of electricity in the device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided an integrated circuit operating as a current-mirror type CMOS amplifier, wherein the first inverter and the second inverter have different conductances.

DETAILED DESCRIPTION OF THE INVENTION

Figure 4:
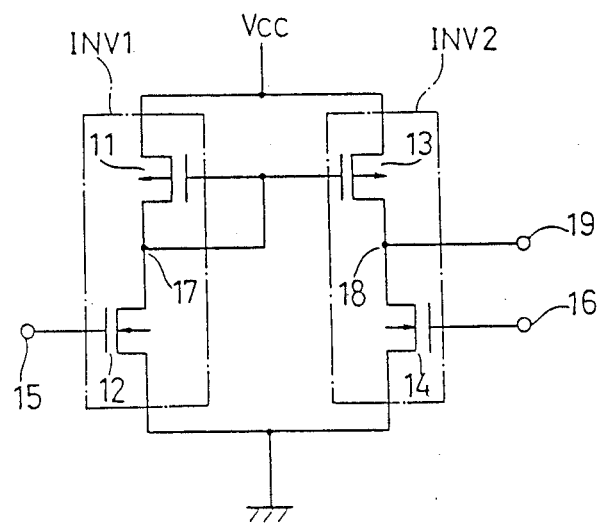
FIG. 4 is a circuit diagram embodying the present invention.

Referring to FIG. 4, which shows a current-mirror type CMOS amplifier, there are provided a first P-channel FET 11, and a first N-channel FET 12, which constitute a first inverter INV1. There are additionally provided a second P-channel FET 13 and a second N-channel FET 14, which constitute a second inverter INV2. The reference numeral 15 and 16 designate a first input terminal and a second input terminal connected to the gates of the N-channel FETs 12 and 14, respectively, and the reference numerals 17 and 18 designate a first node and a second node, respectively. The reference numeral 19 designates an output terminal.

Under the above-mentioned arrangement, the input terminals 15 and 16 are to be applied by complementary signals, and the ratio of the conductances of the P-channel FET 11 and the N-channel FET 12 is equal to the ratio of the conductances of the P-channel FET 13 and the N-channel FET 14, that is, $g_{11}/g_{12}=g_{13}/g_{14}$. In addition, it is designed that the ratio of the conductances of the P-channel FET 11 and the P-channel FET 13 and the ratio of the conductances of the N-channel FET 12 and the N-channel FET 14 are both 1/k, that is, $g_{11}/g_{13}=g_{12}/g_{14}=1/k$, and accordingly that the ratio of the conductances of the first inverter INV1 and the second inverter INV2 is 1/k. Herein, the conductances $g_{13}$ and $g_{14}$ of the FETs 13 and 14 of the second inverter INV2 are equal to the conductances g3 and g4 of the FETs 3 and 4 in FIG. 1.

Figure 1:
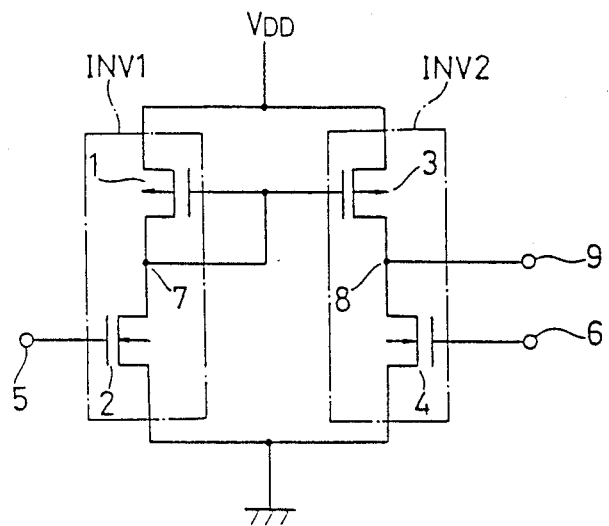
FIG. 1 is a circuit diagram used in the known devices.
Figure 5:
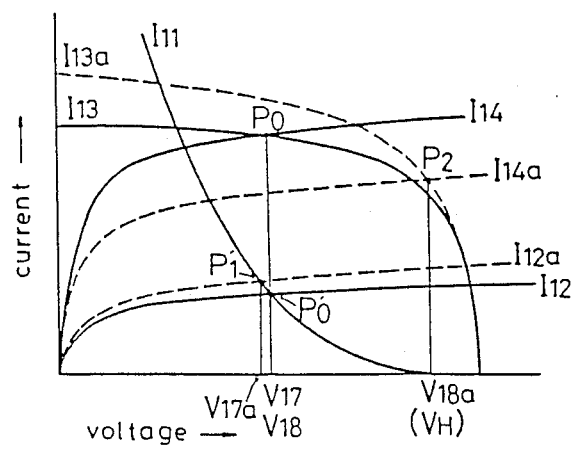
FIGS. 5 and 6 show graphs depicting the voltage-current characteristics of the device emboding the present invention.
Figure 6:
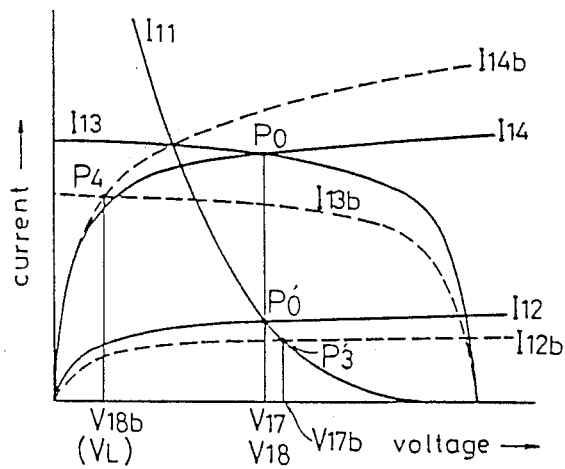

The circuit constructed in the afore-mentioned manner is operated as shown in FIGS. 5 and 6:

When the voltages at the input terminals 15 and 16 are equally Vr, the characteristics of the N-channel FET 12 is represented by a voltage-current curve I12 shown in FIGS. 5 and 6, because the conductance g12 thereof is 1/k compared with the circuit shown in FIG. 1. The voltage-current characteristics of the P-channel FET 11 which is a load of the first inverter INV1 is represented by a voltage-current curve I11, because the drain and the gate thereof are short-circuited, and because the ratio of the conductance thereof to that of the second P-channel FET 13 (g11/g13) is set to 1/k compared with that of the circuit shown in FIG. 1. Thus the potential at a crossing point P0' of the two curves I11 and I12 is obtained as an output voltage V17 of the first inverter INV1.

In this way it is possible to obtain the same output voltage of the first inverter INV1 as that of FIG. 1, that is, V17=V7. The output voltage of the first inverter INV1 is impressed to the gate of the second P-channel FET 13 which is a load of the second inverter INV2, and the voltage-current characteristics of the second P-channel FET 13 and the second N-channel FET 14 are represented in the same manner as those of FIG. 1, as shown by the curves I13 and I14 in FIG. 5. Accordingly, the output voltage V18 at the crossing point P0 of these curves is the same as that of FIG. 1, that is, V18=V8.

At this stage, when complementary inputs (Vr+ΔVr) and (Vr−ΔVr) are applied to the input terminals 15 and 16, the voltage-current curves I12, I13 and I14 change into curves I12a, I13a, and I14a, and the crossing points P0' and P0 shift to P1' and P2. As a result, high voltage V18a (VH) of the crossing point P2 is obtained as an output voltage from the output terminal 19 of the second inverter INV2.

Figure 2:
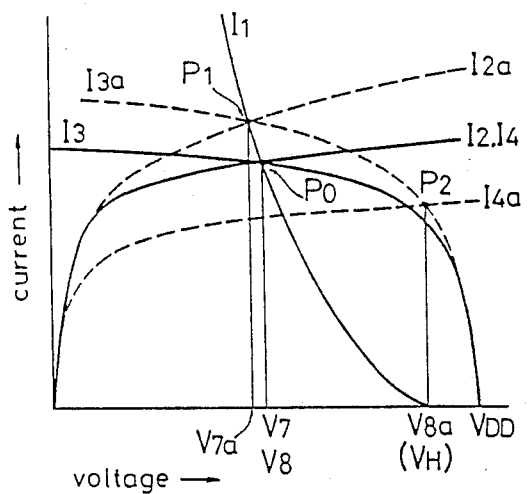
FIGS. 2 and 3 show graphs depicting the characteristics of the known devices.
Figure 3:
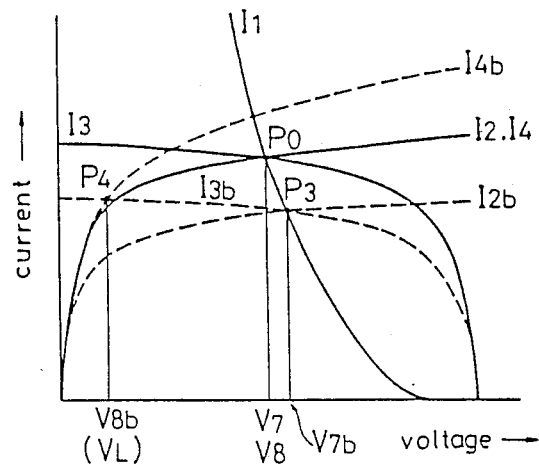

It should be noted that because of the equality of the voltage V7a at P1 in FIG. 2 and the voltage V17a at P1' in the present invention, the second inverters INV2 of the known device and of the present invention output voltages VH of the same amplitude because the P-channel FETs 3 and 13 thereof receive voltages of equal amplitude at the respective gates.

When complementary inputs (Vr−ΔVr) and (Vr+ΔVr) are input to the input terminals 15 and 16, the voltage-current characteristics curves I12, I13 and I14 change into curves I12b, I13b and I14b, and the crossing points P0' and P0 shift to P3' and P4. As a result, low voltage V18b (VL) of the crossing point P4 is obtained as an output voltage from the output terminal 19 of the second inverter INV2.

As evident from the foregoing description, the present invention has eliminated the necessity of equalizing the conductances of the P-channel FETs 1 and 3, and N-channel FETs 2 and 4 but maintained the same function as that achieved under the known devices. Furthermore, the consumption of electricity can be reduced merely by making the conductance of the first inverter INV1 smaller than that of the second inverter INV2, thereby reducing the current flowing through the first inverter INV1.

In the illustrated embodiment, the conductance of the first inverter INV1 is made smaller than that of the second inverter INV2 because it is generally necessary to have an enough current flowing through the second inverter INV2 located at the output stage. But, of course, it is possible to make the conductance of the second inverter smaller than that of the first inverter.

Furthermore, the P-channel FET and N-channel FET can be MOS or any other type if it is an FET device having a high input impedance.

What is claimed is:

1. An integrated circuit operating as a current-mirror type CMOS amplifier, the integrated circuit comprising:
   a first P-channel FET whose source is connected to a power supply with a gate and a drain thereof being connected to a first node;
   a first N-channel FET whose drain is connected to the first node with a gate thereof being connected to a first input terminal and with a source thereof being earthed;
   a first inverter constituted by the first P-channel FET and the first N-channel FET;
   a second P-channel FET whose source is connected to a power supply with a gate thereof being connected to the first node and with a drain thereof being connected to a second node;
   a second N-channel FET whose drain is connected to the second node with a gate thereof being connected to a second input terminal and with a source thereof being earthed;
   a second inverter constituted by the second P-channel FET and the second N-channel FET; and
   the conductance of the first P-channel FET being smaller than that of the second P-channel FET, and the conductance of the first N-channel FET being smaller than that of the second N-channel FET.

2. An integrated circuit as defined in claim 1, wherein the ratio of the conductances of the first P-channel FET and the second P-channel FET is set to be equal to the ratio of the conductances of the first N-channel FET and the second N-channel FET.

3. A current-mirror amplifier circuit comprising:
   a first inverter including,
      a first P-channel FET havng a source connected to a power supply and a gate and a drain connected to a first node,
      a first N-channel FET having a drain connected to the first node, a gate connected to a first input terminal and a source being earthed;
   a second inverter including,
      a second P-channel FET having a source connected to a power supply, a gate connected to the first node and a drain connected to a second node,
      a second N-channel FET having a drain connected to the second node, a gate connected to a second input terminal, and a source being earthed;
   the conductance of said second N-channel FET being greater than the conductant of said first N-channel FET, the conductance of said second P-channel FET being greater than the conductant of said first P-channel FET.

4. The circuit of claim 3 wherein the ratio of the conductances of said first P-channel FET and said first N-channel FET is equal to the ratio of the conductances of said second P-channel FET and said second N-channel FET;
   the ratio of the conductances of said first P-channel FET and said second P-channel FET being equal to the ratio of the conductances of said first N-channel FET and said second N-channel FET.

5. The current-mirror amplifier circuit of claim 3 where said amplifier circuit is formed as a CMOS type integrated circuit.

* * * * *